United States Patent
Wang et al.

(10) Patent No.: US 12,133,323 B2
(45) Date of Patent: Oct. 29, 2024

(54) TRANSMISSION DEVICE FOR SUPPRESSING GLASS FIBER EFFECT

(71) Applicants: UNIMICRON TECHNOLOGY CORP., Taoyuan (TW); National Taiwan University, Taipei (TW)

(72) Inventors: Chin-Hsun Wang, Taipei (TW); Ruey-Beei Wu, Taipei (TW); Ching-Sheng Chen, Taoyuan (TW); Chun-Jui Huang, Taoyuan (TW); Wei-Yu Liao, Taoyuan (TW); Chi-Min Chang, Taoyuan (TW)

(73) Assignees: UNIMICRON TECHNOLOGY CORP., Taoyuan (TW); NATIONAL TAIWAN UNIVERSITY, Taipei (TW)

( * ) Notice: Subject to any disclaimer, the term of this patent is extended or adjusted under 35 U.S.C. 154(b) by 224 days.

(21) Appl. No.: 18/058,381

(22) Filed: Nov. 23, 2022

(65) Prior Publication Data

US 2024/0130038 A1    Apr. 18, 2024

(30) Foreign Application Priority Data

Oct. 14, 2022  (TW) ................... 111139054

(51) Int. Cl.
*H05K 1/02* (2006.01)
*H01P 3/08* (2006.01)

(52) U.S. Cl.
CPC ............. *H05K 1/0242* (2013.01); *H01P 3/08* (2013.01)

(58) Field of Classification Search
CPC ...... H05K 1/0242; H05K 1/0366; H01P 3/08; H01P 11/003
See application file for complete search history.

(56) References Cited

U.S. PATENT DOCUMENTS

| | | | | |
|---|---|---|---|---|
| 7,043,706 | B2 * | 5/2006 | Brist | H05K 1/0366 174/258 |
| 8,648,260 | B2 * | 2/2014 | Ooi | H05K 1/0366 174/251 |
| 10,178,776 | B2 * | 1/2019 | Guo | H05K 1/0306 |
| 2012/0154075 | A1 | 6/2012 | Lai et al. | |
| 2015/0370954 | A1 | 12/2015 | Shen et al. | |
| 2020/0137886 | A1 | 4/2020 | Cheah et al. | |

FOREIGN PATENT DOCUMENTS

| | | |
|---|---|---|
| CN | 105704931 A | 6/2016 |
| JP | 2015050294 A * | 3/2015 |
| TW | 201225747 A1 | 6/2012 |

OTHER PUBLICATIONS

Altera Corporation, "PCB Dielectric Material Selection and Fiber Weave Effect on High-Speed Channel Routing", Jan. 2011, pp. 1-20.

* cited by examiner

*Primary Examiner* — Andrea Lindgren Baltzell
*Assistant Examiner* — Kimberly E Glenn
(74) *Attorney, Agent, or Firm* — Birch, Stewart, Kolasch & Birch, LLP

(57) ABSTRACT

A transmission device for suppressing the glass-fiber effect includes a circuit board and a transmission line. The circuit board includes a plurality of glass fibers, so as to define a fiber pitch. The transmission line is disposed on the circuit board. The transmission line includes a plurality of non-parallel segments. Each of the non-parallel segments of the transmission line has an offset distance with respect to a reference line. The offset distance is longer than or equal to a half of the fiber pitch.

10 Claims, 3 Drawing Sheets

TRANSMISSION DEVICE FOR SUPPRESSING GLASS FIBER EFFECT

CROSS REFERENCE TO RELATED APPLICATIONS

This application claims priority of Taiwan Patent Application No. 111139054 filed on Oct. 14, 2022, the entirety of which is incorporated by reference herein.

BACKGROUND OF THE INVENTION

Field of the Invention

The disclosure generally relates to a transmission device, and more particularly, it relates to a transmission device for suppressing the glass-fiber effect.

Description of the Related Art

The "glass-fiber effect" refers to a phenomenon in which a relative dielectric constant changes due to gaps in the mesh structure of the glass fibers of a PCB (Printed Circuit Board). Generally, a dielectric layer of the PCB usually includes glass fiber cloth and resin. The glass-fiber effect is caused by the different dielectric constants of the two aforementioned materials. The glass-fiber effect may negatively impact the operational performance of the transmission device. For example, clock skews may occur. Accordingly, there is a need to propose a novel solution for solving the problem of the prior art.

BRIEF SUMMARY OF THE INVENTION

In an exemplary embodiment, the disclosure is directed to a transmission device for suppressing the glass-fiber effect. The transmission device includes a circuit board and a transmission line. The circuit board includes a plurality of glass fibers, so as to define a fiber pitch. The transmission line is disposed on the circuit board. The transmission line includes a plurality of non-parallel segments. Each of the non-parallel segments of the transmission line has an offset distance with respect to a reference line. The offset distance is longer than or equal to a half of the fiber pitch.

In some embodiments, each of the non-parallel segments of the transmission line has the same segment length.

In some embodiments, the segment length is longer than the offset distance.

In some embodiments, the segment length is longer than or equal to 100 mil.

In some embodiments, each of the non-parallel segments of the transmission line has a tilt angle with respect to the reference line.

In some embodiments, the tilt angle is determined using the following equation:

$$\theta = \sin^{-1}\left(\frac{R}{L}\right)$$

where "θ" represents the tilt angle, "R" represents the offset distance, and "L" represents the segment length.

In some embodiments, the offset distance is determined using the following inequality:

$$(N-0.4)\cdot P \leq R \leq (N+0.4)\cdot P$$

where "P" represents the fiber pitch, "R" represents the offset distance, and "N" represents any integer.

In some embodiments, the offset distance is determined using the following equation:

$$R = M \cdot P$$

where "P" represents the fiber pitch, "R" represents the offset distance, and "M" represents any integer.

In some embodiments, the offset distance is exactly equal to the fiber pitch.

In some embodiments, the fiber pitch is from 1 mil to 25 mil.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

In order to illustrate the purposes, features and advantages of the invention, the embodiments and figures of the invention are shown in detail as follows.

Figure 1:
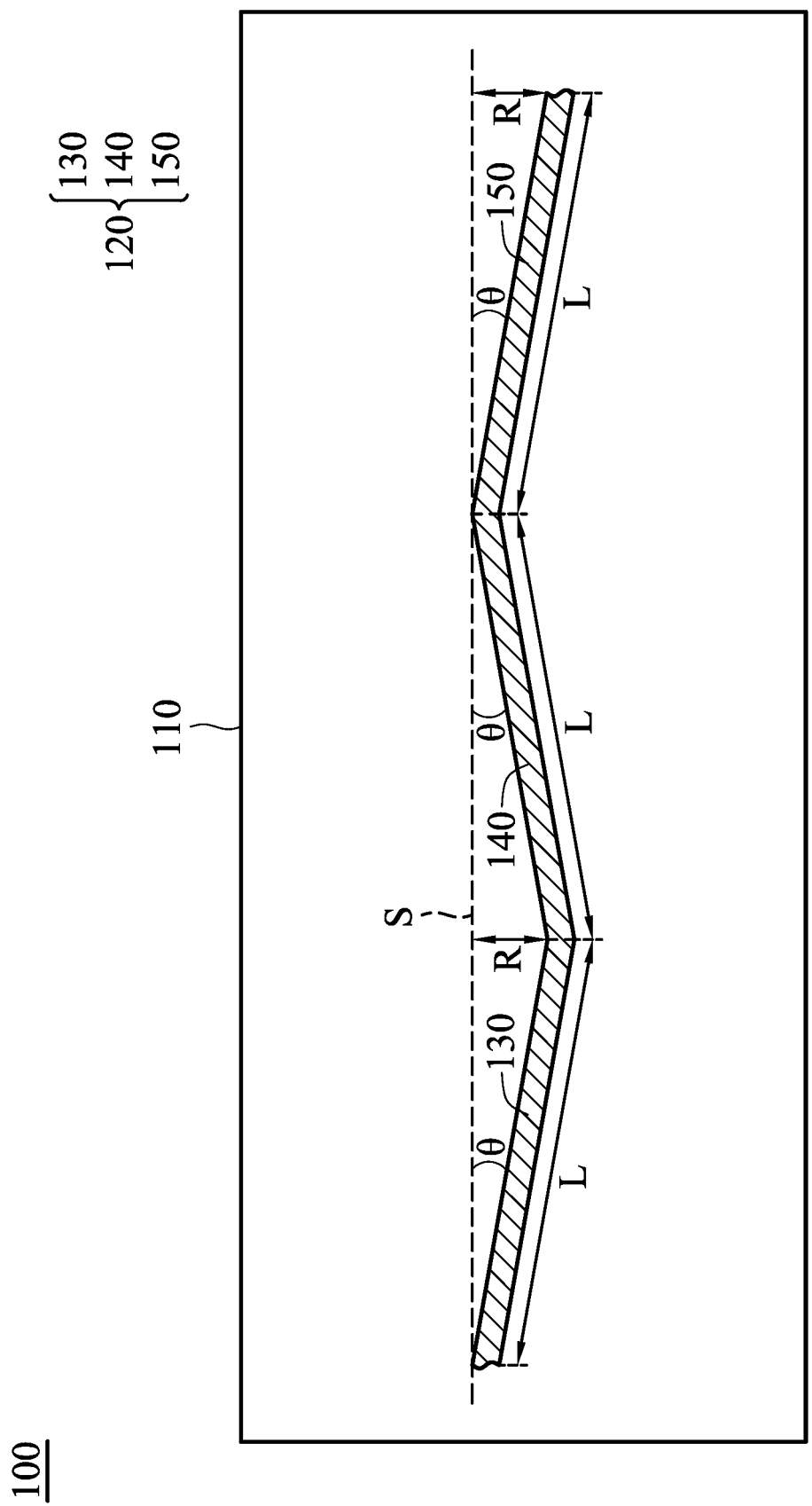
FIG. 1 is a diagram of a transmission device according to an embodiment of the invention.

FIG. 1 is a diagram of a transmission device 100 according to an embodiment of the invention. For example, the transmission device 100 may be implemented with a circuit board device or a semiconductor device, but it is not limited thereto. As shown in FIG. 1, the transmission device 100 at least includes a circuit board 110 and a transmission line 120. The transmission line 120 is disposed on the circuit board 110. It should be understood that the transmission device 100 may further include other components, such as a ground layer or a resin layer, although they are not displayed in FIG. 1.

Figure 2:
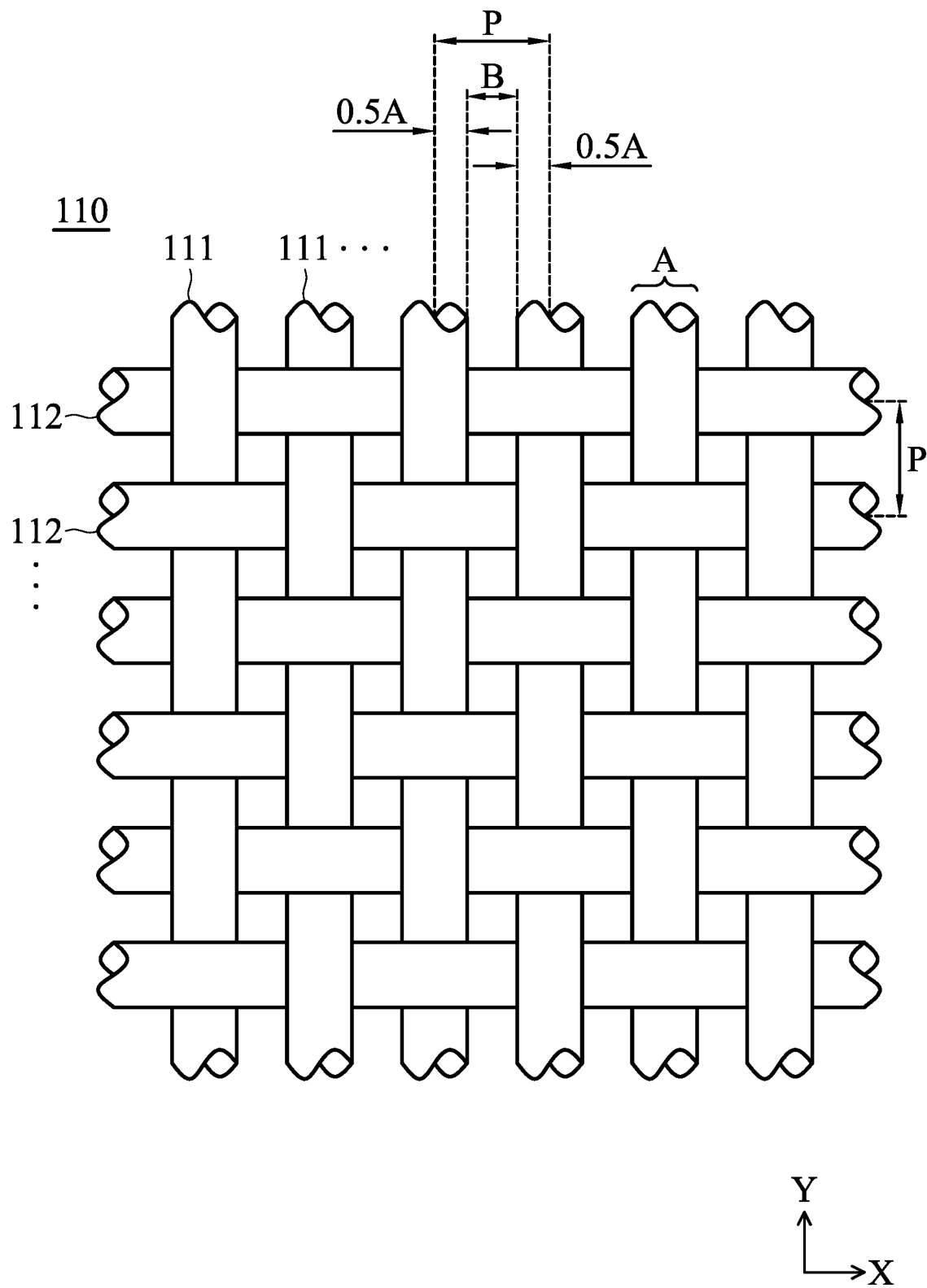
FIG. 2 is a diagram of a partial structure of glass fiber weaving in a circuit board according to an embodiment of the invention.

FIG. 2 is a diagram of a partial structure of glass fiber weaving in the circuit board 110 according to an embodiment of the invention. In the embodiment of FIG. 2, the circuit board 110 includes a plurality of glass fibers 111 and 112, so as to define a fiber pitch P. Specifically, partial glass fibers 111 are arranged parallel to the direction of the Y-axis, and the other partial glass fibers 112 are arranged parallel to the direction of the X-axis. Thus, these glass fibers 111 and 112 are interleaved with each other. For example, each glass fiber may have a fiber width A, and an edge-to-edge distance B may be formed between two adjacent parallel glass fibers. It should be noted that the term "adjacent" or "close" over the disclosure means that the distance (spacing) between two corresponding elements is smaller than a predetermined distance (e.g., 10 mm or shorter), but often does not mean that the two corresponding elements directly touch each other (i.e., the aforementioned distance/spacing is reduced to 0).

In some embodiments, the aforementioned fiber pitch P is defined as a center-to-center distance between two parallel glass fibers, which will be described as the following equation (1):

$$P = 0.5A + B + 0.5A = A + B \quad (1)$$

where "P" represents the fiber pitch P, "A" represents the fiber width A, and "B" represents the edge-to-edge distance B.

Generally, the fiber pitch P may be from 1 mil to 25 mil. However, the invention is not limited thereto. In alternative embodiments, the circuit board 110 has a different style with different fiber weaving, which is adjustable according to a variety of requirements.

Please refer to FIG. 1 again. The style and type of the transmission line 120 are not limited in the invention. For example, the transmission line 120 may be a strip line or a microstrip line. Specifically, the transmission line 120 includes a plurality of non-parallel segments 130, 140 and 150. The non-parallel segment 140 is coupled between the other two non-parallel segments 130 and 150. The transmission line 120 substantially extends along the direction of a reference line S. The reference line S may be a virtual straight line. The total number of the aforementioned non-parallel segments is adjustable according to different requirements. In alternative embodiments, the transmission line 120 includes 4, 5, 6 or more non-parallel segments.

For example, the transmission line 120 may alternately extend in the upper right and lower right directions, but it is not limited thereto. It should be noted that each of the non-parallel segments 130, 140 and 150 of the transmission line 120 has an offset distance R with respect to the reference line S, and the offset distance R is longer than or equal to a half of the fiber pitch P. That is, in some embodiments, the offset distance R will be described as the following inequality (2):

$$R \geq 0.5 \cdot P \quad (2)$$

where "R" represents the offset distance R, and "P" represents the fiber pitch P.

In some embodiments, each of the non-parallel segments 130, 140 and 150 of the transmission line 120 has a first terminal and a second terminal. Its first terminal may be positioned on the reference line S, and the distance between its second terminal and the reference line S may be the same as the aforementioned offset distance R. In addition, each of the non-parallel segments 130, 140 and 150 of the transmission line 120 may have the same segment length L. The segment length L is longer than the offset distance R. For example, the segment length L may be longer than or equal to 100 mil, but it is not limited thereto.

In some embodiments, each of the non-parallel segments 130, 140 and 150 of the transmission line 120 has a tilt angle θ with respect to the reference line S. For example, the tilt angle θ may be considered as an angle between the reference line S and the corresponding non-parallel segment. Specifically, the tilt angle θ may be described as the following equation (3):

$$\theta = \sin^{-1}\left(\frac{R}{L}\right) \quad (3)$$

where "θ" represents the tilt angle θ, "R" represents the offset distance R, and "L" represents the segment length L.

According to the equation (3), if the segment length L is much longer than the offset distance R, the tilt angle θ will become very small. Therefore, the transmission line 120 can occupy relatively small design area on the circuit board 110. In some embodiments, the tilt angle θ is simply calculated using a Monte Carlo method, without using more compli- cated 3D (Three-Dimensional) electromagnetic simulation software, so as to significantly reduce the whole computation cost.

Figure 3:
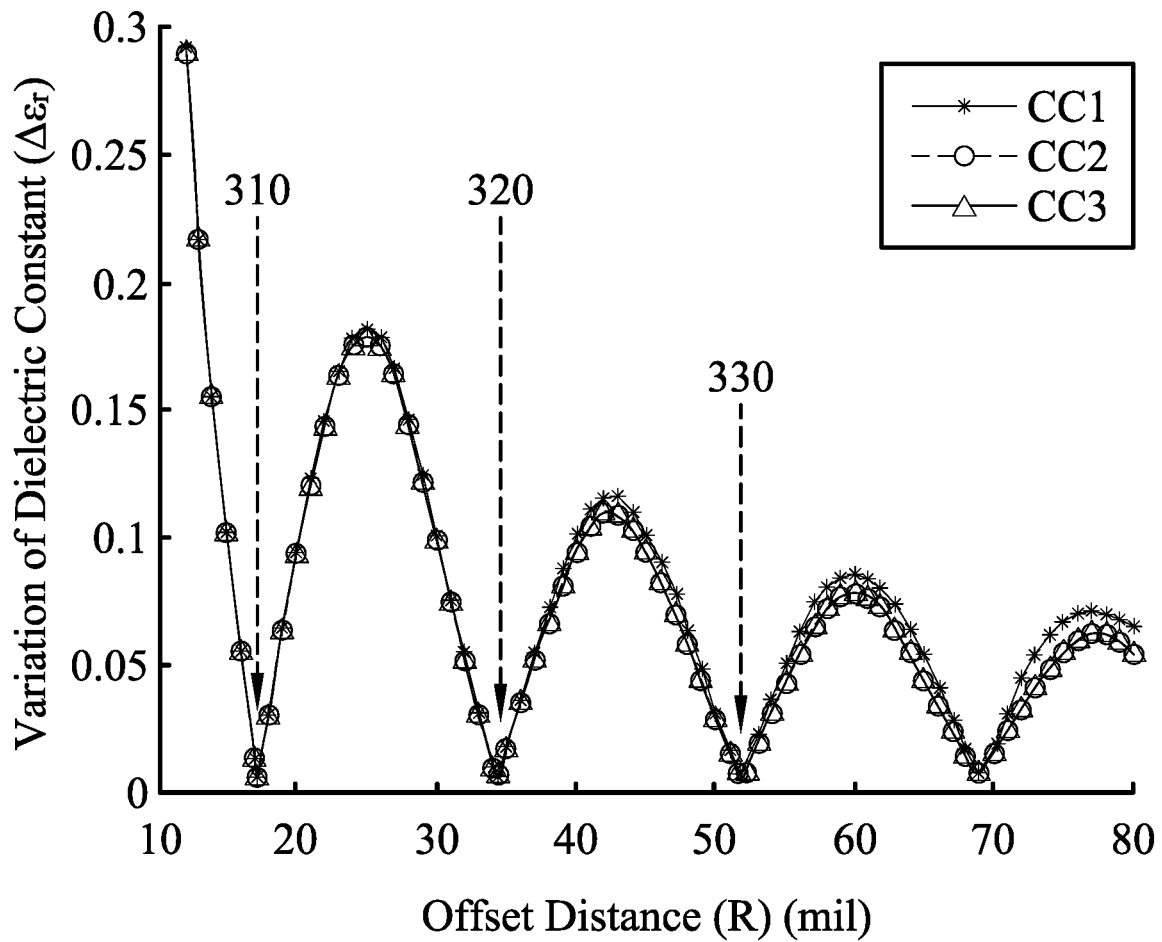
FIG. 3 is a diagram of relationship between an offset distance and a variation of a dielectric constant of a transmission device according to an embodiment of the invention.

FIG. 3 is a diagram of the relationship between the offset distance R and the variation $\Delta\varepsilon_r$ of the dielectric constant of the transmission device 100 according to an embodiment of the invention. As mentioned above, because there is a non-ideal glass-fiber effect, the dielectric constant of the transmission device 100 is not a constant value. Its variation $\Delta\varepsilon_r$ of the dielectric constant is used to indicate a change in the dielectric constant of the transmission device 100 in response to different offset distances R. As shown in FIG. 3, a first curve CC1 represents the characteristics of the transmission device 100 when the segment length L is relatively short (e.g., 100 mil), a second curve CC2 represents the characteristics of the transmission device 100 when the segment length L is relatively median (e.g., 500 mil), and a third curve CC3 represents the characteristics of the transmission device 100 when the segment length L is relatively long (e.g., 1000 mil). According to the simulation of FIG. 3, the variation $\Delta\varepsilon_r$ of the dielectric constant is insensitive to different segment lengths L. In addition, when the offset distance R is longer than or equal to a half of the fiber pitch P, the variation $\Delta\varepsilon_r$ of the dielectric constant can be maintained at a relatively low and acceptable level.

In some embodiments, the offset distance R will be described as the following inequality (4):

$$(N-0.4) \cdot P \leq R \leq (N+0.4) \cdot P \quad (4)$$

where "P" represents the fiber pitch P, "R" represents the offset distance R, and "N" represents any integer.

According to the simulation of FIG. 3, when the offset distance R falls within the range defined by the inequality (4), the variation $\Delta\varepsilon_r$ of the dielectric constant can be further reduced.

In some embodiments, the offset distance R will be described as the following equation (5):

$$R = M \cdot P \quad (5)$$

where "P" represents the fiber pitch P, "R" represents the offset distance R, and "M" represents any integer.

According to the simulation of FIG. 3, when the offset distance R satisfies the equation (5), the variation $\Delta\varepsilon_r$ of the dielectric constant can be almost reduced to 0. For example, the offset distance R may be equal to the fiber pitch P (R=P) as indicated by a first arrow 310, the offset distance R may be twice the fiber pitch P (R=2 P) as indicated by a second arrow 320, and the offset distance R may be triple the fiber pitch P (R=3 P) as indicated by a third arrow 330. In other words, the non-ideal glass-fiber effect of the transmission device 100 can be almost eliminated completely.

In some embodiments, the offset distance R is exactly equal to the fiber pitch P, which will be described as the following equation (6):

$$R = P \quad (5)$$

where "P" represents the fiber pitch P, and "R" represents the offset distance R.

According to the simulation of FIG. 3, when the offset distance R satisfies the equation (6), the variation $\Delta\varepsilon_r$ of the dielectric constant can be almost reduced to 0, and the design area where the circuit board 110 is occupied by the transmission line 120 can be also minimized. In comparison to the conventional design, the invention can significantly suppress the glass-fiber effect on the condition that the waste of space is reduced.

The invention proposes a novel transmission device. Compared to the conventional design, the invention has at least the advantages of suppressing the glass-fiber effect, minimizing the size of transmission line, and eliminating the clock skew, and therefore it is suitable for application in a variety of circuit board devices or semiconductor devices.

Note that the above element sizes, element shapes, and element parameters are not limitations of the invention. A designer can fine-tune these settings or values according to different requirements. It should be understood that the transmission device of the invention is not limited to the configurations of FIGS. 1-3. The invention may merely include any one or more features of any one or more embodiments of FIGS. 1-3. In other words, not all of the features displayed in the figures should be implemented in the transmission device of the invention.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A transmission device for suppressing a glass-fiber effect, comprising:
    a circuit board, comprising a plurality of glass fibers, so as to define a fiber pitch; and
    a transmission line, disposed on the circuit board, wherein the transmission line comprises a plurality of non-parallel segments;
    wherein each of the non-parallel segments of the transmission line has an offset distance with respect to a reference line, and the offset distance is longer than or equal to a half of the fiber pitch.

2. The transmission device as claimed in claim 1, wherein each of the non-parallel segments of the transmission line has a same segment length.

3. The transmission device as claimed in claim 2, wherein the segment length is longer than the offset distance.

4. The transmission device as claimed in claim 2, wherein the segment length is longer than or equal to 100 mil.

5. The transmission device as claimed in claim 2, wherein each of the non-parallel segments of the transmission line has a tilt angle with respect to the reference line.

6. The transmission device as claimed in claim 5, wherein the tilt angle is determined using the following equation:

$$\theta = \sin^{-1}\left(\frac{R}{L}\right)$$

wherein "θ" represents the tilt angle, "R" represents the offset distance, and "L" represents the segment length.

7. The transmission device as claimed in claim 1, wherein the offset distance is determined using the following inequality:

$$(N-0.4)\cdot P \leq R \leq (N+0.4)\cdot P$$

wherein "P" represents the fiber pitch, "R" represents the offset distance, and "N" represents any integer.

8. The transmission device as claimed in claim 1, wherein the offset distance is determined using the following equation:

$$R = M\cdot P$$

wherein "P" represents the fiber pitch, "R" represents the offset distance, and "M" represents any integer.

9. The transmission device as claimed in claim 1, wherein the offset distance is exactly equal to the fiber pitch.

10. The transmission device as claimed in claim 1, wherein the fiber pitch is from 1 mil to 25 mil.

* * * * *